United States Patent
Osann, Jr. et al.

(10) Patent No.: US 6,804,812 B2
(45) Date of Patent: Oct. 12, 2004

(54) DEPOPULATED PROGRAMMABLE LOGIC ARRAY

(75) Inventors: Robert Osann, Jr., Los Altos, CA (US); Patrick Hallinan, Campbell, CA (US); Jung Lee, Sunnyvale, CA (US); Shridhar Mukund, San Jose, CA (US)

(73) Assignee: Lightspeed Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 10/458,892

(22) Filed: Jun. 10, 2003

(65) Prior Publication Data

US 2003/0212979 A1 Nov. 13, 2003

Related U.S. Application Data

(62) Division of application No. 09/827,015, filed on Apr. 5, 2001.
(60) Provisional application No. 60/231,059, filed on Sep. 8, 2000.

(51) Int. Cl.[7] .............................................. G06F 17/50
(52) U.S. Cl. .......................................... 716/16; 716/17
(58) Field of Search ............................... 716/16, 17, 4; 712/15; 326/39, 40, 16, 7

(56) References Cited

U.S. PATENT DOCUMENTS

| | | | |
|---|---|---|---|
| 4,761,768 A | 8/1988 | Turner et al. ............... 365/201 |
| 5,543,732 A * | 8/1996 | McClintock et al. .......... 326/41 |
| 5,566,127 A | 10/1996 | Hoshizaki .............. 365/230.06 |
| 5,572,148 A | 11/1996 | Lytle et al. ................... 326/41 |
| 5,646,545 A | 7/1997 | Trimberger et al. .......... 326/38 |
| 5,670,897 A | 9/1997 | Kean ........................... 326/41 |
| 5,708,597 A | 1/1998 | Kelem .................... 365/230.03 |
| 5,715,197 A | 2/1998 | Nance et al. .......... 365/189.02 |
| 5,732,407 A | 3/1998 | Mason et al. ................ 711/104 |
| 5,744,980 A | 4/1998 | McGowan et al. ........... 326/40 |
| 5,796,269 A | 8/1998 | New ............................ 326/40 |
| 5,801,547 A | 9/1998 | Kean ........................... 326/40 |
| 5,809,281 A | 9/1998 | Steele et al. ........... 395/497.01 |
| 5,821,773 A | 10/1998 | Norman et al. ............... 326/39 |
| 5,844,854 A | 12/1998 | Lee ........................ 361/230.01 |
| 5,861,761 A | 1/1999 | Kean ........................... 326/41 |
| 5,883,852 A | 3/1999 | Ghia et al. ............. 365/230.05 |
| 5,886,538 A | 3/1999 | New ............................ 326/40 |
| 6,029,236 A | 2/2000 | Steele et al. ................ 711/170 |
| 6,263,482 B1 | 7/2001 | Schleicher .................... 716/17 |
| 6,266,760 B1 * | 7/2001 | DeHon et al. ................ 712/15 |
| 6,311,316 B1 * | 10/2001 | Huggins et al. .............. 716/12 |

OTHER PUBLICATIONS

*Matsumoto, C., LSI's SoC formula: FPGA plus ASICS, Electronic Times, 1999, n 1072, PG 1, Aug. 2, 1999.

(List continued on next page.)

*Primary Examiner*—Linh M. Nguyen
(74) *Attorney, Agent, or Firm*—Sarah Barone Schwartz; Haynes Beffel & Wolfeld LLP

(57) ABSTRACT

A programmable logic array (PLA) in accordance with the invention achieves a maximum amount of depopulation of programmable connections while still implementing a logic function and maintaining flexibility for future reprogramming. In addition, a PLA in accordance with the invention can be built so that no matter what functionality is programmed, performance characteristics for the device are maintained. Further, a PLA in accordance with the invention does not require a regular array structure.

24 Claims, 19 Drawing Sheets

OTHER PUBLICATIONS

*Souza, C., Programmable core opens door to SOC market, Electronic Buyers News, 1999, N 1171, PG5, Aug. 2, 1999.
*LSI Logic to pry open market with FPGA core, Electronic News, Jul. 29, 1999.
*Luca Carloni, Computer Science 294–7 Lecture #20 Compute Blocks, www.cs.berkeley.edu, spring 1997.
*Afonso G. Ferreira and Siang W. Song, Achieving Optimality for Gate Matrix Layout and PLA Folding: A Graph Theoretic Approach, in *Latin '92, $1^{st}$ Latin American Symposium on Theoretical Informatics, São Paulo, Brazil, Apr. 6–10, 1992 Proceedings*, Simon, I. (Ed.), Springer–Verlag, Berlin, pp. 139–153.

* cited by examiner

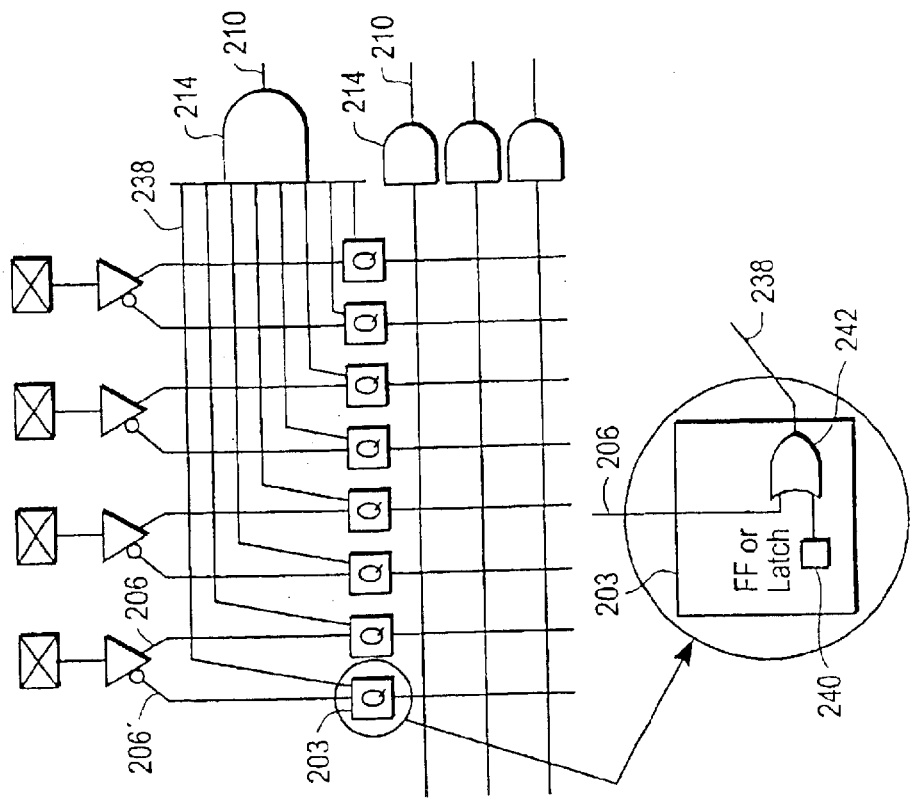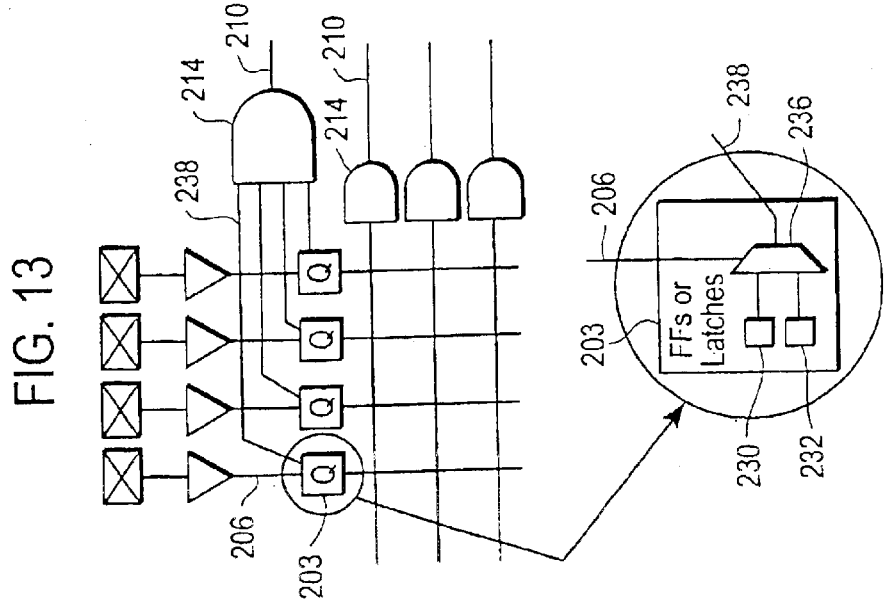

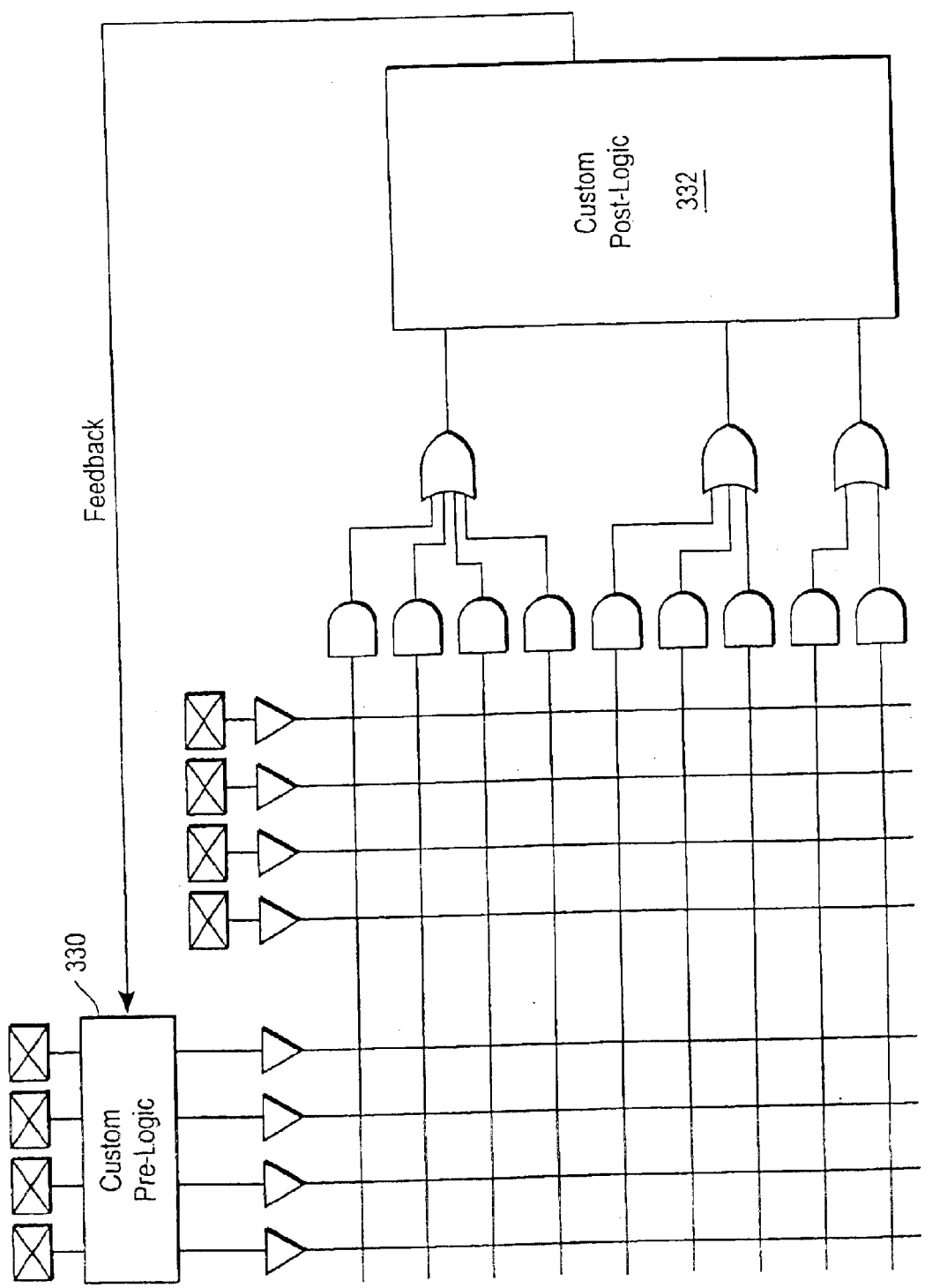

DEPOPULATED PROGRAMMABLE LOGIC ARRAY

CROSS-REFERENCE TO RELATED APPLICATIONS

This application is a divisional of application Ser. No. 09/827,015, filed Apr. 5, 2001, entitled "Depopulated Programmable Logic Array," which claims priority to Provisional Application No. 60/231,059, filed Sep. 8, 2000. This application is related to application Ser. No. 09/512,783, filed Feb. 25, 2000, entitled "Programmable Logic Array Embedded in Mask-Programmed ASIC," incorporated by reference herein.

FIELD OF INVENTION

This invention generally relates to programmable logic arrays (PLAs), and particularly to minimizing the size and speed of PLAs.

BACKGROUND

Programmable Logic Arrays (PLAs) have been used in the semiconductor industry for many years. They are essentially generic electronic circuits, able to be programmed to provide a variety of logic functions. PLAs are well understood in the art, but a brief explanation is provided below.

In PLAs, a logic function to be implemented is expressed in product terms (AND terms) and sum terms (OR terms). Each product term is generated by circuitry that can be programmed to form the AND of any subset of the inputs to the PLA and their complements. Product terms are then be summed, or OR'd, through additional programmable circuitry.

More specifically, PLAs are generally constructed in the form of regular arrays, with the input lines being orthogonal to the product lines, as shown in the generalized circuit diagram of FIG. 1. FIG. 1 shows one type of PLA known as a PAL. In FIG. 1, PAL 100 includes inputs 102, A–D, where each input and its complement is input into programmable AND array 104 on lines 106. AND lines 108 are formed orthogonal to lines 106. When a selected intersection between an input-term line 106 and an AND line 108 is programmed, then "AND terms" or "product terms" 110 are formed. The product terms 110 are then fed into OR gates 112 forming "sum terms" 114.

As is understood in the art, product-terms are often implemented with a wired-OR mechanism, where at each intersection of lines 106 and 108 programmable transistors 115 are used. A pull-up 116 is also used, as shown in the generalized circuit diagram of FIG. 2. Although the pull-up 116 is shown as a resistor in FIG. 2, frequently a passive pull-up is implemented with a biased P-channel transistor instead. It will be noted that when using the structure of FIG. 2, the AND gates 109 shown in FIG. 1 are not actually physically present, but instead in FIG. 1 AND gates 109 represent logically the function being performed.

A second type of PLA structure (sometimes referred to as a "Full PLA") is shown in FIG. 3, having both a programmable AND array 104 and a programmable OR array 117. In other words, both product terms and sum terms can be programmed. Thus, the device of FIG. 3 can implement any set of combinational logic limited only by the number of inputs, outputs, and product terms.

Relative to the device of FIG. 1, the device of FIG. 3 sacrifices some speed, but has greater programming flexibility and is better for implementing state machines. As well, unlike the FIG. 1 device, in the FIG. 3 device, each product term can be used by, or shared among, all sum terms. Still, as shown in FIG. 4, some PLA devices create OR arrays where selected groups of the product terms are shared among selected groups of the sum terms.

Flexibility of PLA structures, including those of FIGS. 1 and 3, can be further enhanced by adding flip-flops 118 (shown in FIG. 3) to one or more of the outputs to create general-purpose sequential circuits. As shown in FIG. 5, inverted product terms such as !PT can also be fed back directly into the AND array. As used herein, complemented terms will be indicated with either a "!" or with an overbar, as is the practice in the art. As shown in FIG. 5a, when many product terms are inverted and fed back, it forms what is known as a NAND-NAND (or NOR-NOR) array.

Many PLA devices also include post-array logic structures as shown in FIG. 6. The most frequent need for such structures is to complement a logic function—otherwise, to complement the function, one would have to resort to DeMorgan's Law (!(AB)=(!A+!B)), typically resulting in a large number of product terms that would need to be programmed. XOR gates 120 are commonly used as such post-array structures. Inversion can be controlled by (1) a sum term representing a complex function (as for XOR gate $120_1$), (2) a single product term (as for XOR gate $120_2$), or (3) by a single logic value that can be programmed to a logical "1" ($V_{dd}$) or "0" ($V_{ss}$) (as for XOR gate $120_3$).

Similarly, pre-array logic structures 122 are also often used as shown in FIG. 7. Such pre-array logic structures are often useful in performing arithmetic functions such as accumulators. Both post-array and pre-array logic structures are used to reduce the number of product terms that would otherwise be required, and hence allow the use of smaller and faster PLA devices.

Each of the conventional PLA structures described in FIGS. 1–7 is usually a discrete device and is programmable and reprogrammable by the user either using a specialized programming device or in-system as is understood in the art. As should be understood in the art from FIGS. 1–7, there are numerous types of PLAs available and those described are exemplary only.

As alluded to above with the discussion of pre- and post-array structures, it is generally desirable to use the smallest PLA device available, for real-estate reasons as well as speed. To that end, "PLA folding" has been studied and is described in Ferreira and Song, "Achieving Optimality for Gate Matrix Layout and PLA Folding: a Graph Theoretic Approach", 1992. In general, PLA folding is a technique that, given a PLA, attempts to produce an equivalent PLA that occupies less space. For example, consider the following logic functions to be implemented by a PLA:

$$f_6 = \bar{v}_1 v_5 + \bar{v}_2 \bar{v}_3 + v_1 v_3 + \bar{v}_5$$

$$f_7 = v_2 v_4 + \bar{v}_2 v_4$$

These functions are shown implemented in a traditional PLA in FIG. 8, where the "dots" represent a programmed connection. Through a series of matrix manipulation and rearranging of rows, the result of the folding is shown in FIG. 9. More details of this example can be found in Ferreira and Song (cited above). As shown in FIG. 9, the folded PLA is much more compact, retaining as much physical regularity as possible by causing the tiling of product term groupings.

Still, this PLA folding technique has gained little practical application. To effectively use folding, an engineer must know with relative certainty the functions to be programmed. And the freedom to make changes to the functionality is severely limited by the "folds." Moreover, PLAs are typically only available as discrete devices (e.g., PLDs) in fixed sizes with fixed characteristics. So while folding techniques might be useful in theory, there are essentially no devices using them.

SUMMARY

A PLA in accordance with an embodiment of the invention is designed after knowing the initial logic to be implemented by the PLA. Once such logic is known, a PLA sized specifically to that logic is modelled. Then unnecessary programmable connections are removed creating a relatively small, but fast PLA to implement the given function. Additional programmable connections are then re-added to the model to allow for future reprogramming. Finally, the modelled PLA is constructed.

The result is a PLA that achieves a maximum amount of depopulation while still implementing a logic function and maintaining flexibility for future reprogramming. In addition a PLA in accordance with an embodiment of the invention can be built so that no matter what functionality is programmed, the performance characteristics for the device remain the same.

A PLA in accordance with an embodiment of the invention does not require a regular array structure. Therefore, such a PLA is flexible for place and route considerations, particularly when integrated with other logic in larger circuits.

BRIEF DESCRIPTION OF THE DRAWINGS

The present invention is described with respect to particular exemplary embodiments thereof and reference is accordingly made to the drawings in which:

FIGS. 13 and 13a functionally illustrate a core cell in accordance with an embodiment of the invention;

FIGS. 14 and 14a functionally illustrate a core cell in accordance with another embodiment of the invention;

FIG. 16 illustrates an embodiment of the invention with pre- and post-array logic;

DETAILED DESCRIPTION

The beauty of a PLA structure is that any logic function can be implemented that fits within the size of the structure, where the size is determined by the number of product terms (p-terms), sum terms, inputs, registered outputs, and feedback terms. The flexibility and programmability of a PLA is especially desirable for circuitry that is not fully verified or may need to be changed in the future. However, the genericness of the PLA can cause the size of the PLA to be significantly large since the physical paths and gates to support all possible overall functionalities must be constructed. In fact, a programmed PLA usually has only a small percentage of the possible logic functionality utilized. In addition to the large size of a conventional PLA relative to the logic it is implementing, the circuit speed is also hindered due to the additional capacitive loading of driving circuitry, as well as the capacitance of driving longer lines due to the larger overall size of the array.

But if the function of the PLA is known before the PLA is physically constructed then a methodology can be employed where the portions of the PLA that are not required to perform the specific function can be eliminated. Even with this "depopulation" in effect, changes and enhancements can still be implemented if some amount of additional product term capability is included in the array. An example of a PLA built after its initial functionality is known can be found in application Ser. No. 09/512,793, filed Feb. 25, 2000, and entitled "Programmable Logic Array Embedded in Mask-Programmed ASIC," incorporated by reference herein, which describes a reprogrammable PLA implemented in an otherwise non-reprogrammable ASIC.

Thus, in accordance with an embodiment of the invention, selected programmable connections (e.g, intersections) of a PLA are removed, "depopulating" the PLA, to minimize the space and maximize the speed of the PLA. The connections that are removed are connections that will not be used in by the functionality to be initially programmed in the PLA. Nonetheless, certain initially unnecessary programmable connections are selectively placed in the array to allow for future reprogramming of the array with functionality different then that initially intended.

Depopulation

Figure 10:
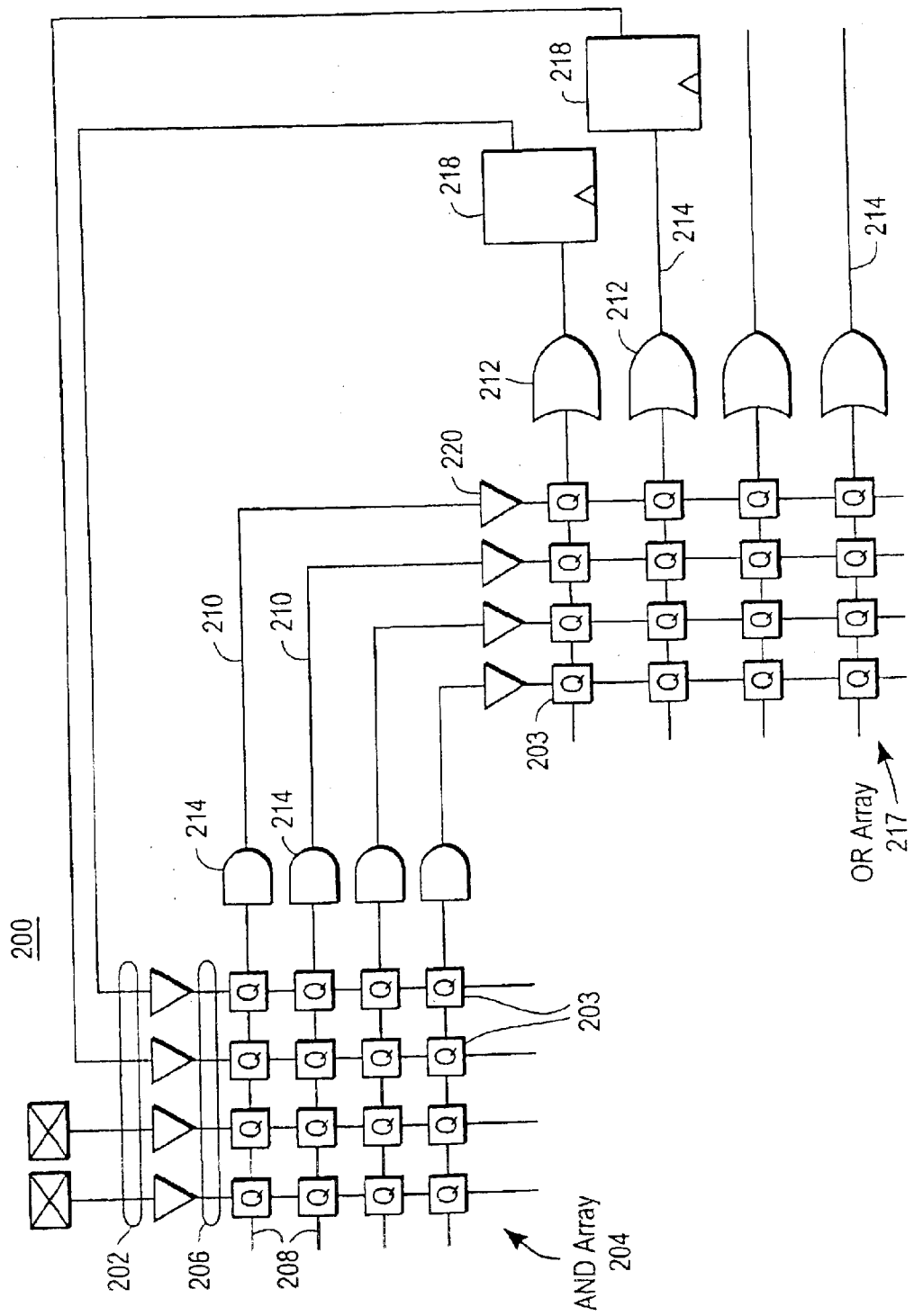
FIG. 10 is a functional diagram of a fully populated PLA in accordance with an embodiment of the invention.

FIG. 10 shows a "fully populated PLA" 200. Each intersection in the AND array 204 between input lines 206 and AND lines 208 includes a programmable connection, here shown as core cells 203, which will be described in further detail below and are marked with a "Q". Similarly, each intersection in the OR array 217 has a similar core cell 203. Buffers 220 may be used in some embodiments for driving the various signals. But because of the number of potential programmable signals, a single buffer in each column may not be sufficient and, therefore, buffer trees may be required to sufficiently drive the loads.

The PLA 200 is designed and constructed specifically to accommodate a function defined by a user. To do so, the user provides a description of the functionality in HDL or other similar language. The description is analyzed, in some embodiments by software (e.g., a PLA compiler), and a PLA sized to accomodate the functionality results. In other words, a fully programmable PLA having the minimal number of inputs, outputs (sum terms), and p-terms to accomodate the logic is designed. A small percentage of additional capacity (a small amount of additional p-terms or sum-terms) to handle reprogramming changes are then added, resulting in the design of the PLA structure of FIG. 10.

Figure 11:
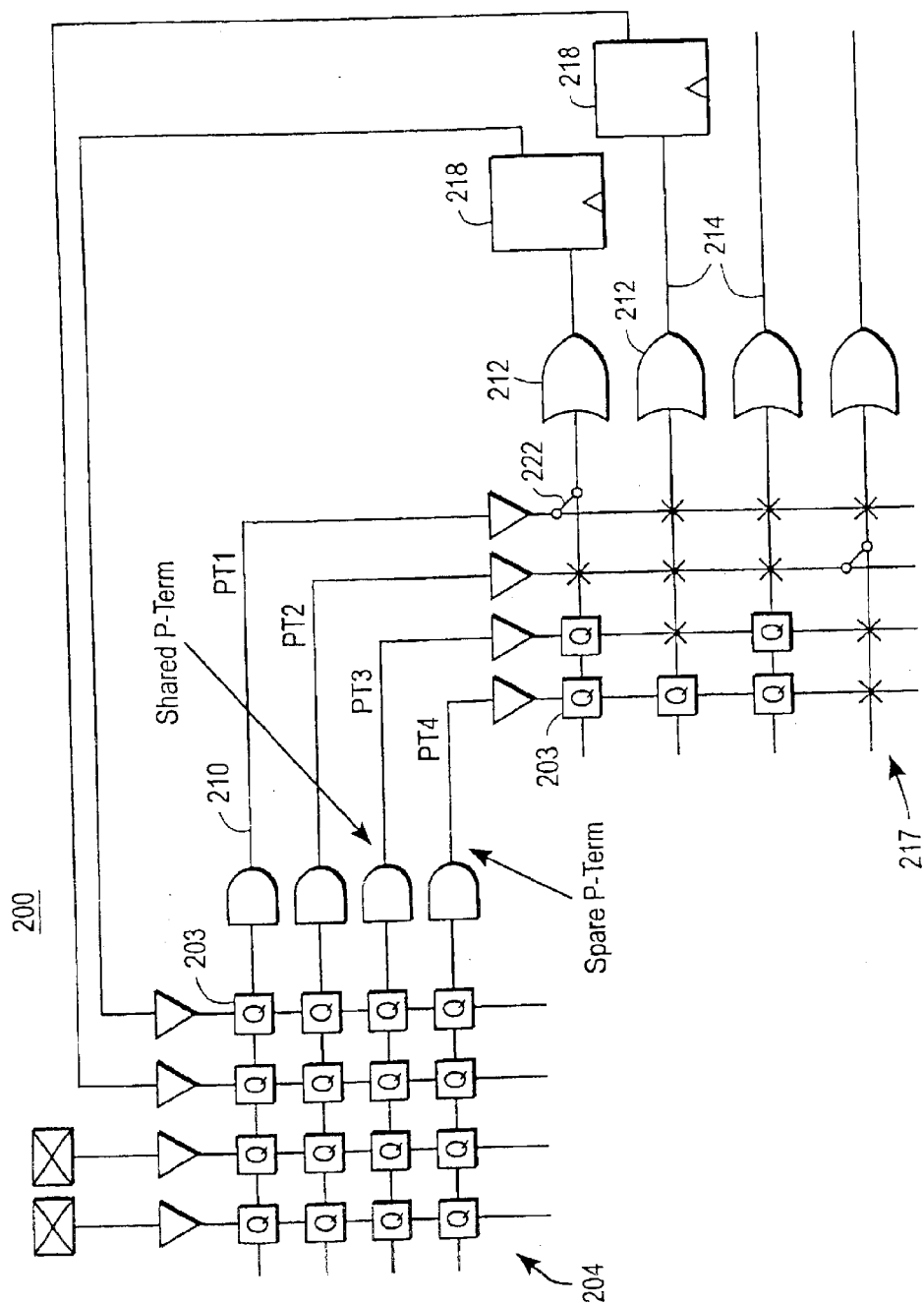
FIG. 11 is a functional diagram of an intermediately populated PLA in accordance with an embodiment of the invention.

FIG. 11 shows the PLA 200 redesigned to have a depopulated OR array 217, sometimes referred to herein as an "intermediately populated PLA." Many of the programmable connections (core cells 203) have been removed (depopulated) as denoted by an "X" at the intersection, indicating that there is no connection—programmable or otherwise—at that location. The intersections to be depopulated are selected based on the description of functionality to be initially implemented by a PLA as provided by the user. Those intersections that are not required by the user's defined functionality are removed. In addition, where product terms (p-terms) are not shared by OR gates, such as PT1 and PT2, the programmable connection has been removed and a fixed, or hardwired, connection 222 has been inserted instead. Note that an OR array that has been fully depopulated, where all the programmable connections have been removed and replaced with fixed connections, results in a fixed OR array structure such as that found in traditional PAL devices.

When the programmable connections are removed the PLA size is decreased: not only are the devices for the programmable connections removed, but the OR trees 212 (discussed further below) are also reduced in size. As a result, the overall speed of the device increases.

But some programmable connections have been strategically kept in FIG. 11. For instance, where a product term is shared between two or more OR gates, such as PT3, then programmable connections remain at the used intersections: if a p-term that was once shared later changes so that it is no longer part of a sum term, it can be programmably disconnected from that sum term. In addition, programmable connections remain in the OR array for spare p-terms such as PT4 to accommodate future programming. Spare p-terms will not generally be used by the user's initial functionality but are provided to add later programming flexibility.

Figure 12:
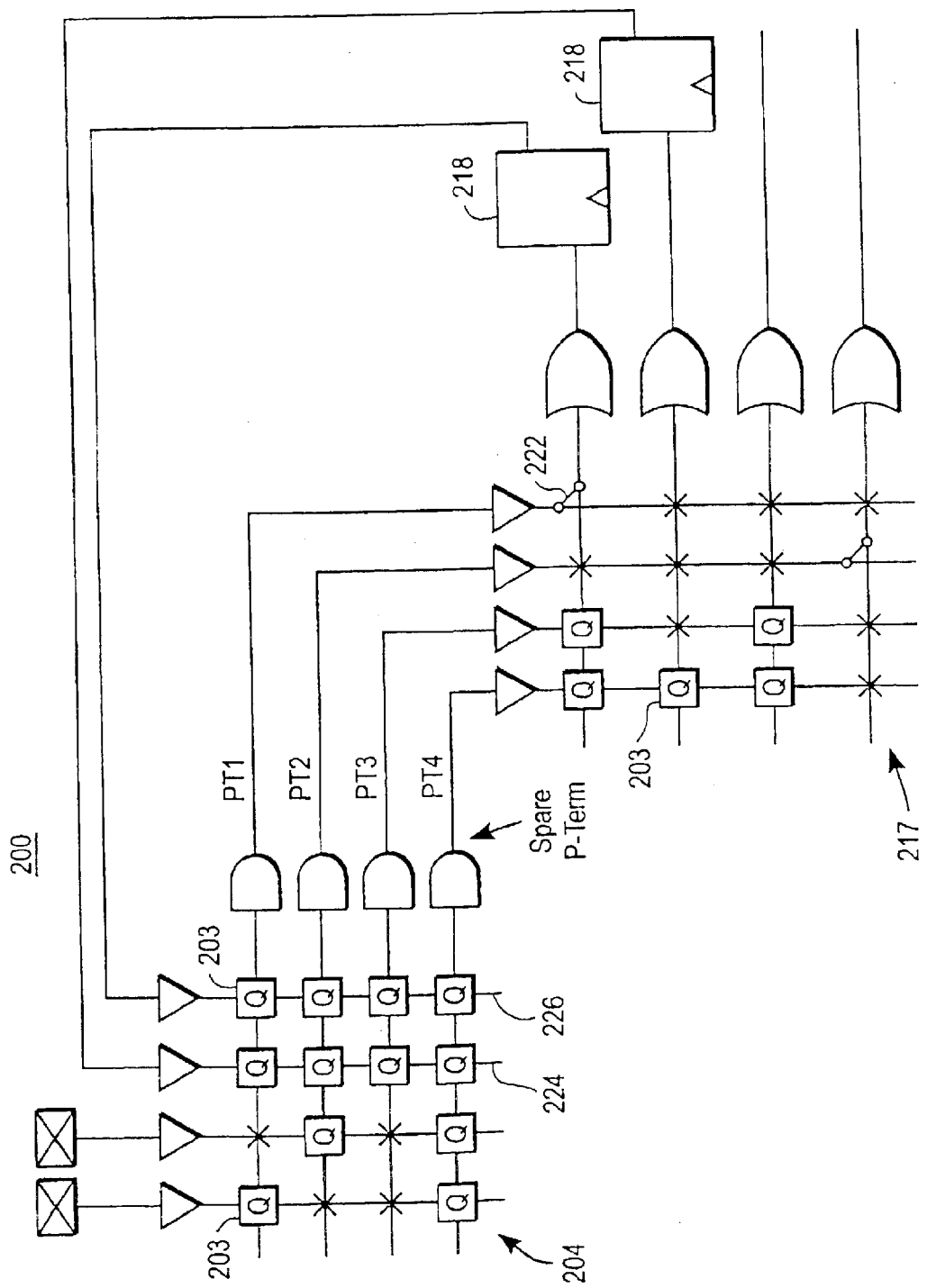
FIG. 12 is a functional diagram of a minimally populated PLA in accordance with an embodiment of the invention.

FIG. 12 shows the PLA 200 further redesigned to have both a depopulated OR array 217 and a depopulated AND array 204, sometimes referred to herein as a "minimally populated PLA." Compared to the structures of FIGS. 10 and 11, the configuration of FIG. 12 produces the smallest and fastest PLA, but will sacrifice some of the flexibility found in the other two structures. Depopulation is again determined based on the functionality initially to be implemented by the PLA as defined by a PLA user—programmable connections are removed except where input variables are actually used in the initial logic function to be implemented. Then selected intersections are re-populated before the array is actually constructed according to a combination of strategies.

One strategy for selective re-population of the AND array is to maintain full population on all columns 224, 226 where input variables are fed back from flip-flops 218 or other registers (e.g., state bits or other registered signal used to construct sequential logic functions). For instance, in sequential logic, many times a future change will involve altering an output to change the edge of a waveform so that the edge happens on a different state. Such alterations can often be easily accomplished by choosing a different logic condition on the feedback bits, but to so with an existing p-term, the needed feedback signals must be populated.

Another strategy is to allow the PLA user to specify that certain input variables (certain columns) must be fully populated. In other embodiments, the user might specify that a certain input variable be fully populated for certain p-terms or all p-terms that are connected with specific outputs (sum terms).

In addition, any spare p-terms such as PT4 are fully-populated. Since future functionality to be programmed is unknown, it is best to allow full programmability of spare p-terms.

Strategies for selective re-population of the OR array will be similar to those discussed for the intermediately populated PLA. Other strategies for selective re-population of either array may also be used in other embodiments and those discussed are exemplary only.

In sum, in accordance with an embodiment of the invention, a description of functionality to be implemented in a PLA is received by a program such as a PLA compiler. The description is analyzed and a fully populated PLA is modeled. Then, either the OR array, the AND array, or both are depopulated to remove all unnecessary programmable connections in the model. Strategically selected intersections are then repopulated within the model with programmable connections to allow for future reprogramming. Finally, the PLA is physically constructed based on the modelled PLA.

Core Cells

As mentioned above, core cells 203 are programmable connections. The core cells, in one embodiment of a PLA in accordance with the invention, may look much like conventional PLAs as described with respect to FIG. 2—e.g., product terms implemented with a wired-OR mechanism by connecting multiple transistors to an AND line. In other words, each core cell is essentially a programmable transistor. This wired-OR approach, however, typically requires a PLA structure with a regular array, i.e., one that has wired-OR lines that have the same length and loading, because sense amps are usually coupled to the AND line to amplify signals. If the wired-OR lines are not all the same length with the same loading, then the sense amps would necessarily also have to be different, creating complicated design issues.

So in other embodiments of the invention, the p-terms are implemented differently from conventional wired-OR structures. For instance, FIG. 13 shows a portion of an AND array where core cells 203 program the product terms. As shown in FIG. 13a, two latches or two flip-flops can be used to form such a core cell 203. For discussion purposes only, these devices in the core cells will simply be referred to herein as latches, although it is to be understood that they could be flip-flops in various embodiments. The core cell 203 includes latch 230 and latch 232. Each latch 230, 232 is coupled to mux 236. The select line 206 to mux 236 is an input to the AND array. The mux output 238 is input into multi-input AND gate 214 (FIG. 13), whose output forms a product term. AND gate 214 may be formed using a tree of AND gates as will be understood in the art. Although some illustrations of the invention show a single AND line running to an AND gates, it is to be understood that embodiments such as shown in FIG. 13 (and FIG. 14) will actually have multiple lines coupled to AND gates 214.

Each latch 230, 232 is programmed to store a value that dictates how the core cell 203 will behave upon receiving an input signal on a line 206. Programming is done in accordance with Table 1:

TABLE 1

| Latch 230 | Latch 232 | Output 238 |
| --- | --- | --- |
| 1 | 0 | Positive (I) |
| 0 | 1 | Negative ($\bar{\text{I}}$) |
| 1 | 1 | Don't care |
| 0 | 0 | Disable P-term |

Thus, when latch 230 stores a logical 1 and latch 232 stores a logical 0, the signal input on line 206 will be output on line 238. When latch 230 stores a logical 0 and latch 232 stores a logical 1, the signal input on line 206 will be inverted on line 238. When both latches 230 and 232 store a logical 1, it indicates a "don't care" condition—no matter what is input on line 206, the product-term will not be affected. But if latches 230 and 232 both store a logical 0, the entire p-term will be disabled (a 0 input into an AND gate always results in a 0 output).

When used to program the OR array, the core cell is programmed in accordance with Table 2:

TABLE 2

| Latch 230 | Latch 232 | Output 238 |
|---|---|---|
| 1 | 0 | Positive (p-term true) |
| 0 | 1 | Negative (p-term complement) |
| 1 | 1 | Force output high |
| 0 | 0 | Disable P-term |

An alternative embodiment of a PLA core cell 203 is shown in FIGS. 14 and 14a. In FIG. 14a, a single latch or flip-flop 240 is coupled to an OR gate 242. The second input 206 (or 206') to the 2-input OR gate 242 is formed from the input signal or its complement. When latch 240 stores a logical 0, the output of OR gate 242 carries the value of the signal input on line 206 (206'). When the latch 240 stores a logical 1, the input is a "don't care"—it will not effect the p-term.

A comparison of FIGS. 13 and 14 illustrates that in FIG. 14, while only one storage device 240 is required, two physical input lines 206, 206' (one positive and one negative) must be run through the array for each signal input into the array, while in FIG. 13 two storage devices are utilized, 230 and 232, but only one physical input line 206 need be run through the array for each input. In addition, in FIG. 13, AND gate 214 is only half as wide as that in FIG. 14. Although both embodiments are useful, FIG. 13 has the advantage in deep-submicron semiconductor technology that the total wire length has been cut in half. Although the fanout-dependent loading in FIG. 13 will be double that of FIG. 14, it is not fanout loading but absolute wire length that is the predominant factor in determining delays in today's semiconductor devices.

Nonetheless, some embodiments of the invention will use both of the FIG. 13a and FIG. 14a embodiments. For instance, one embodiment will use the cell structure of FIG. 13a in the AND array while using the cell structure of FIG. 14a in the OR array. Because the OR array does not always require all four of the permutations described in Table 2, but only a care/don't care function, using the embodiment of FIG. 14a allows for a smaller OR array.

Figure 1:
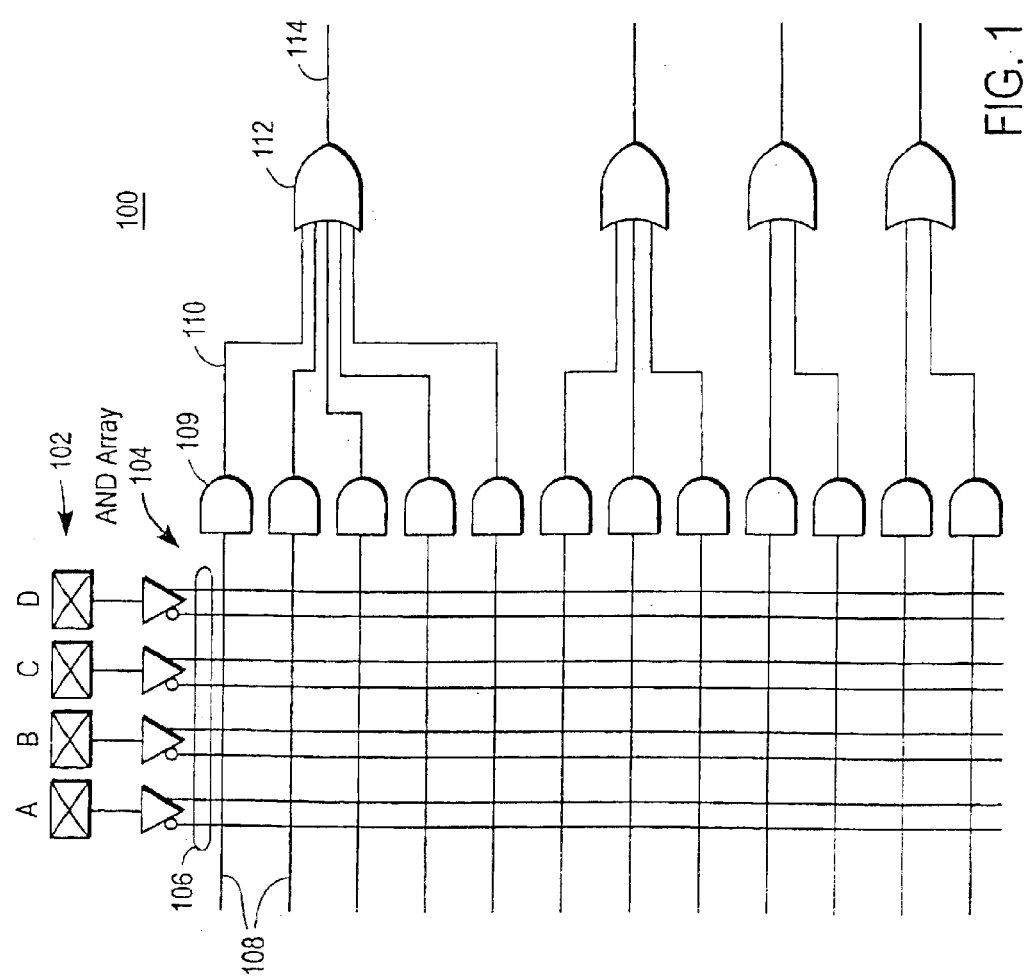
FIG. 1 is a functional diagram of a conventional PAL-type PLA.
Figure 2:
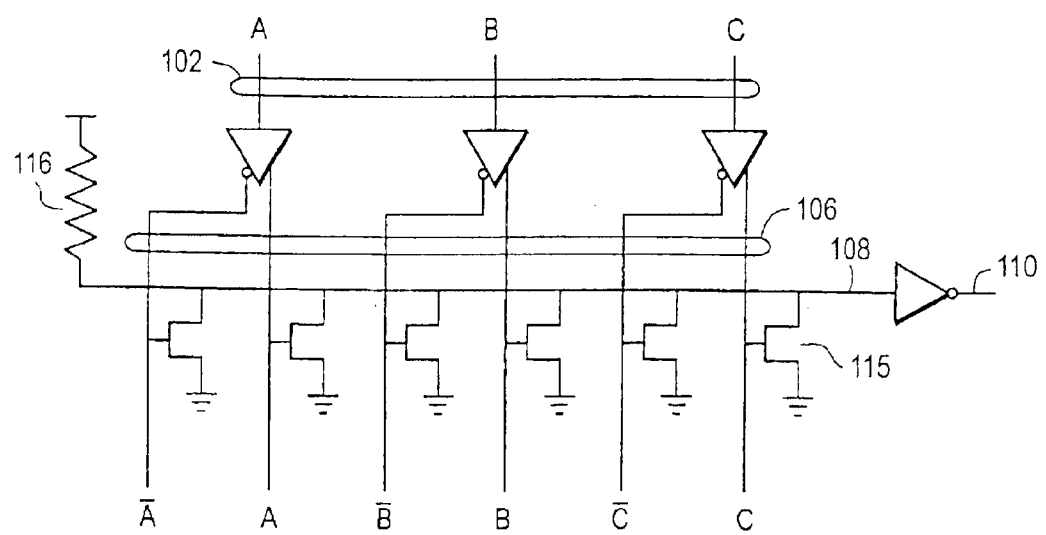
FIG. 2 illustrates a conventional wired-OR structure.
Figure 3:
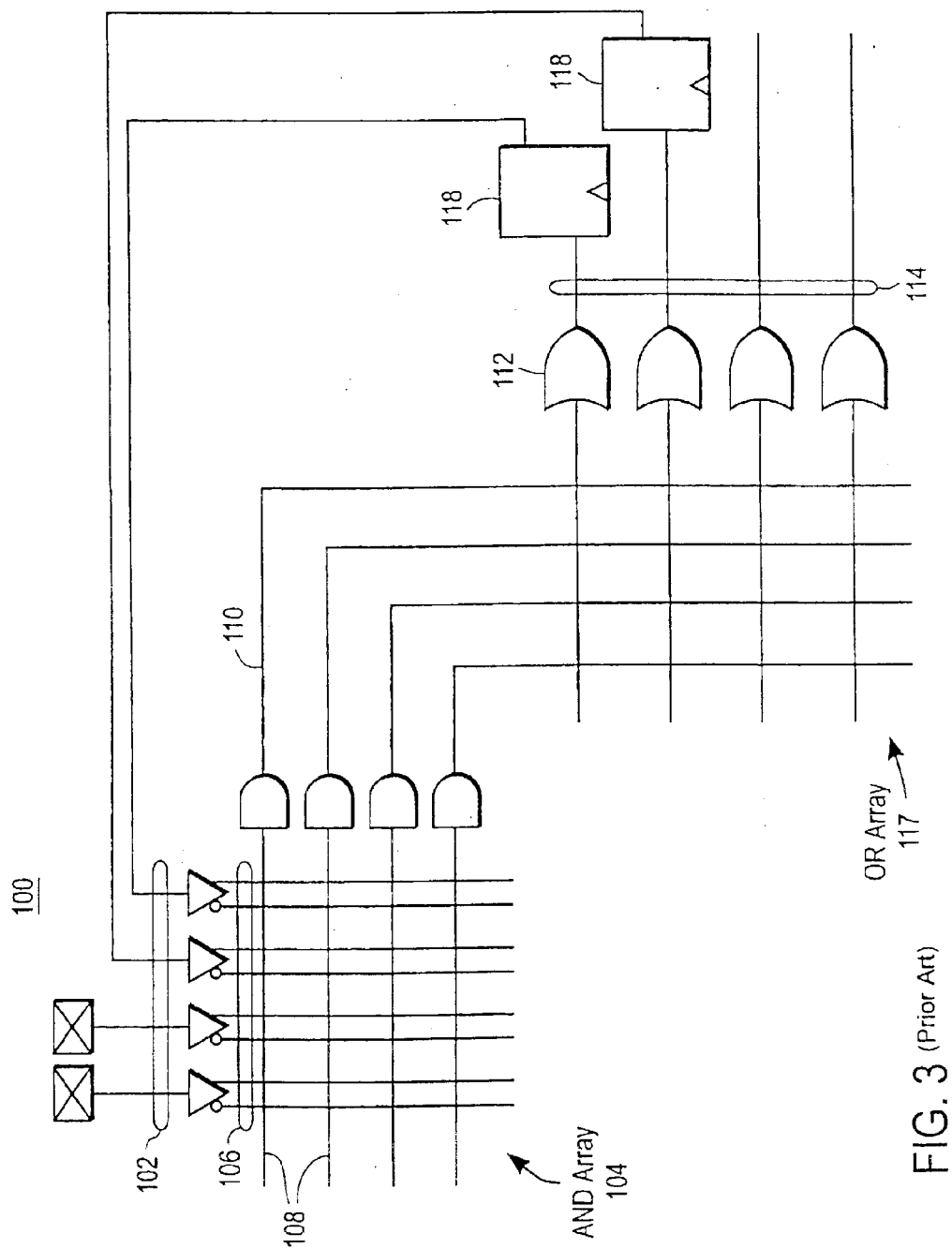
FIG. 3 is a functional diagram of a conventional full PLA.
Figure 4:
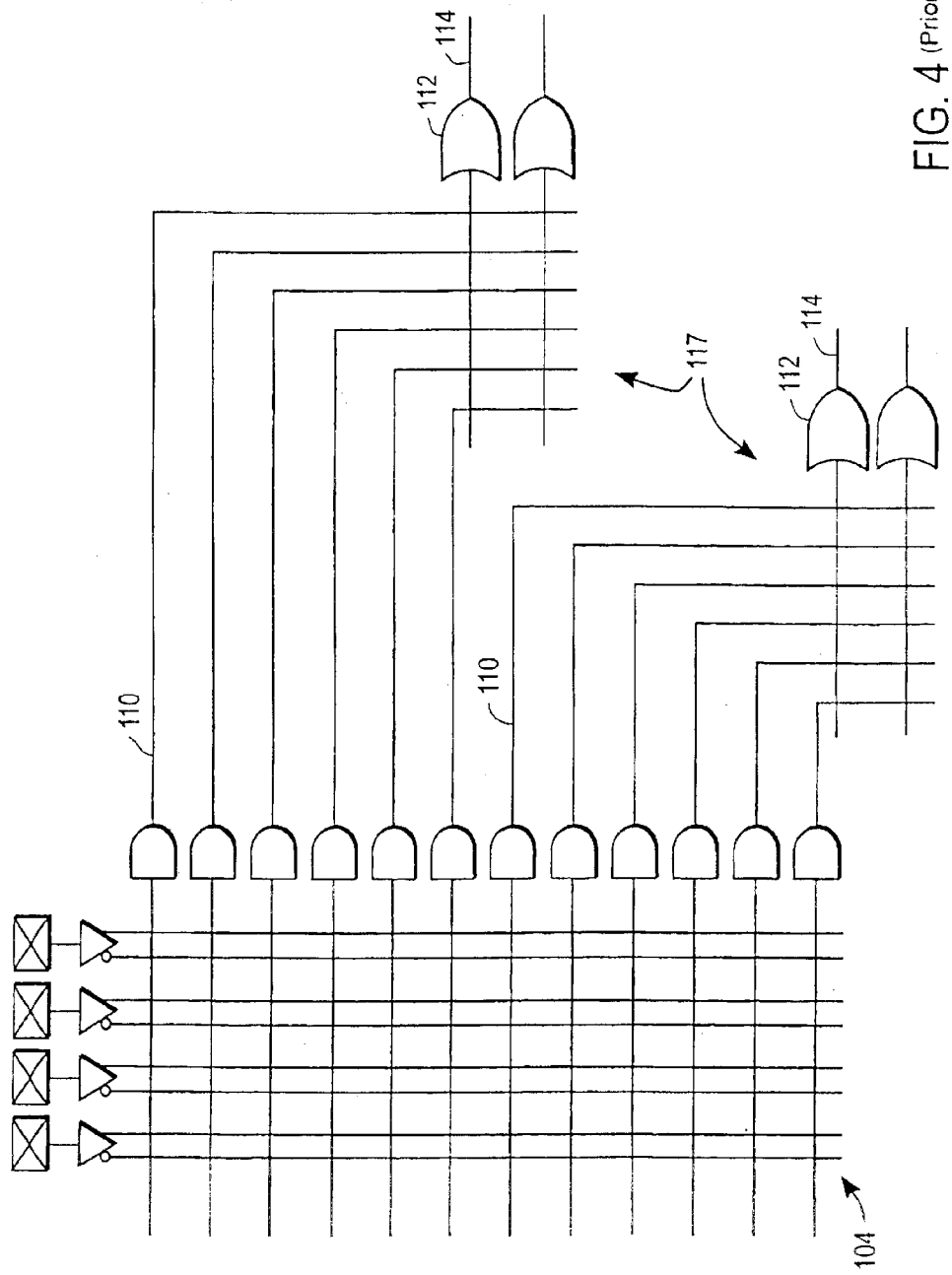
FIG. 4 illustrates product-term sharing in conventional PLA structures.
Figure 5:
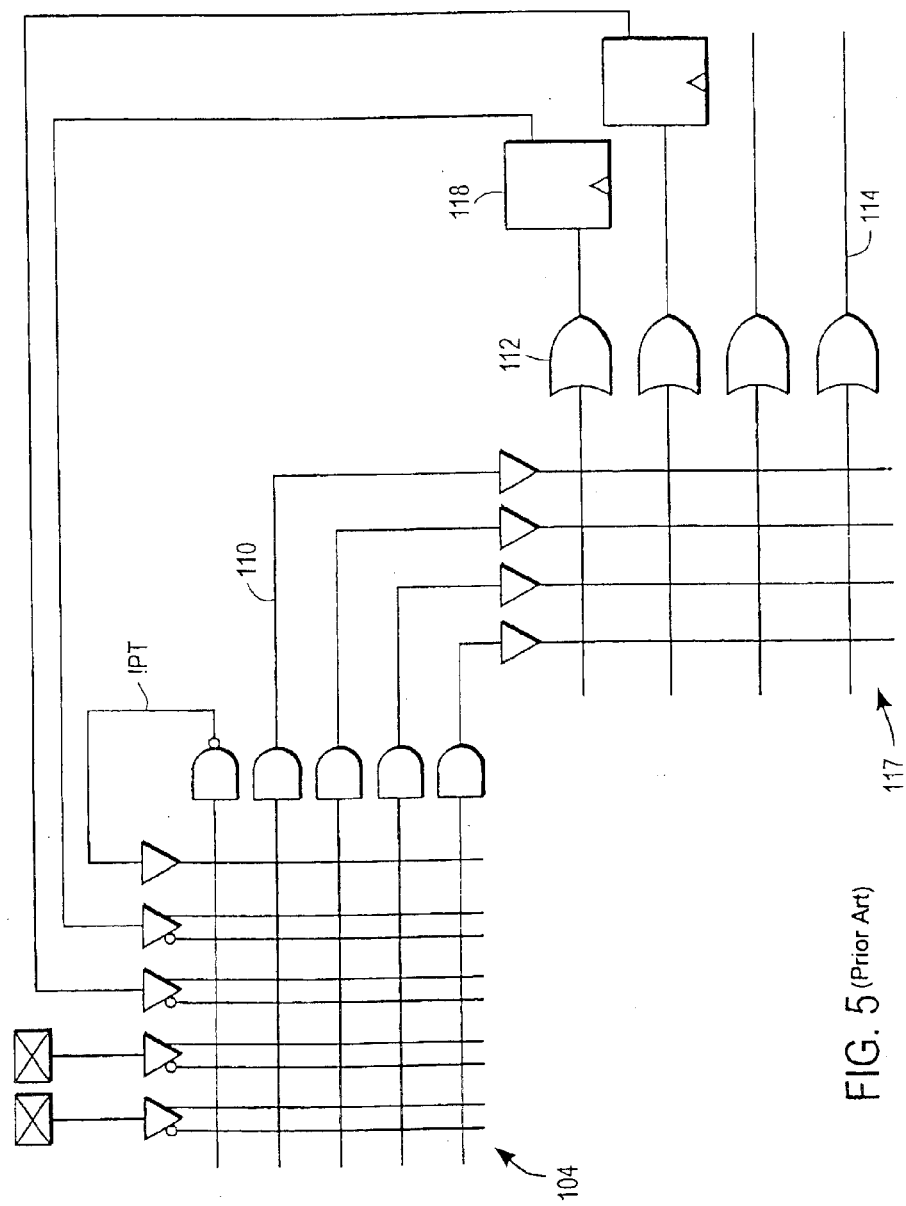
FIG. 5 illustrates complemented product terms in conventional PLA structures.
Figure 5A:
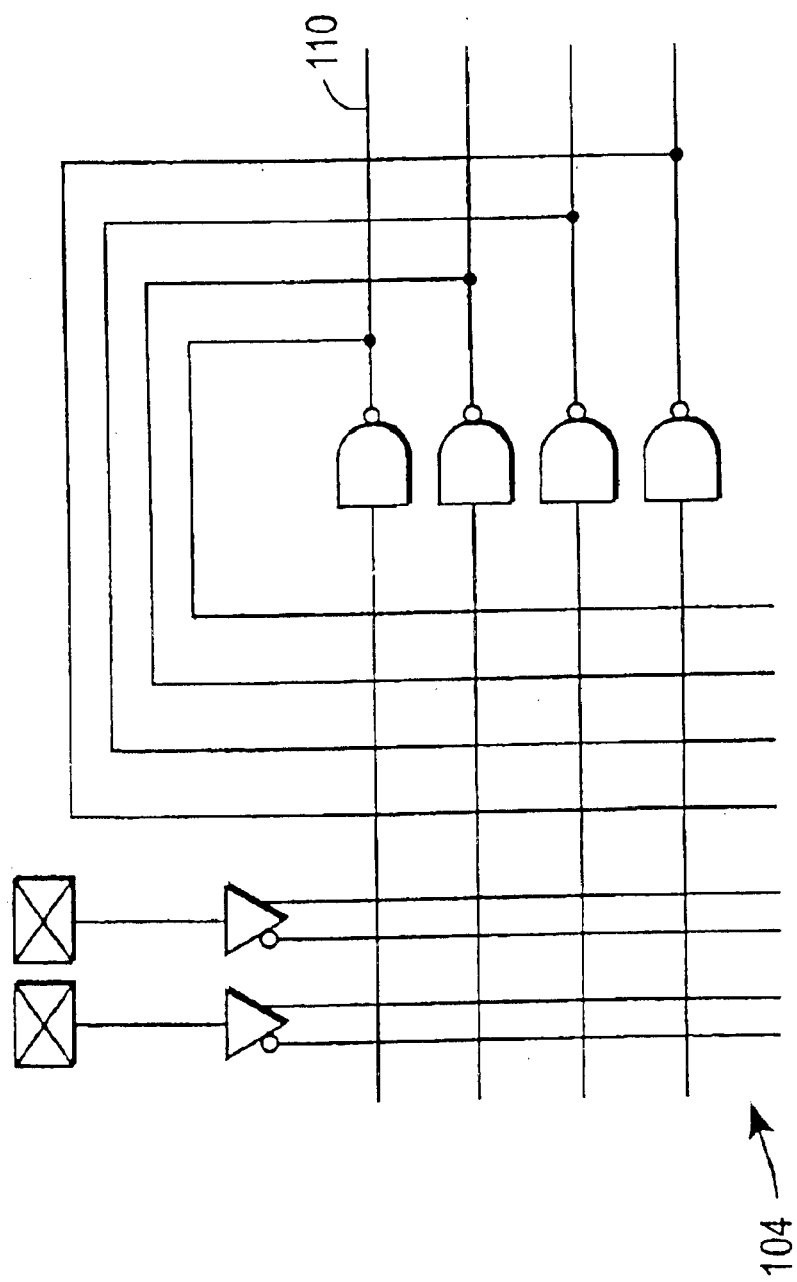
FIG. 5a illustrates a conventional NAND-NAND array.
Figure 6:
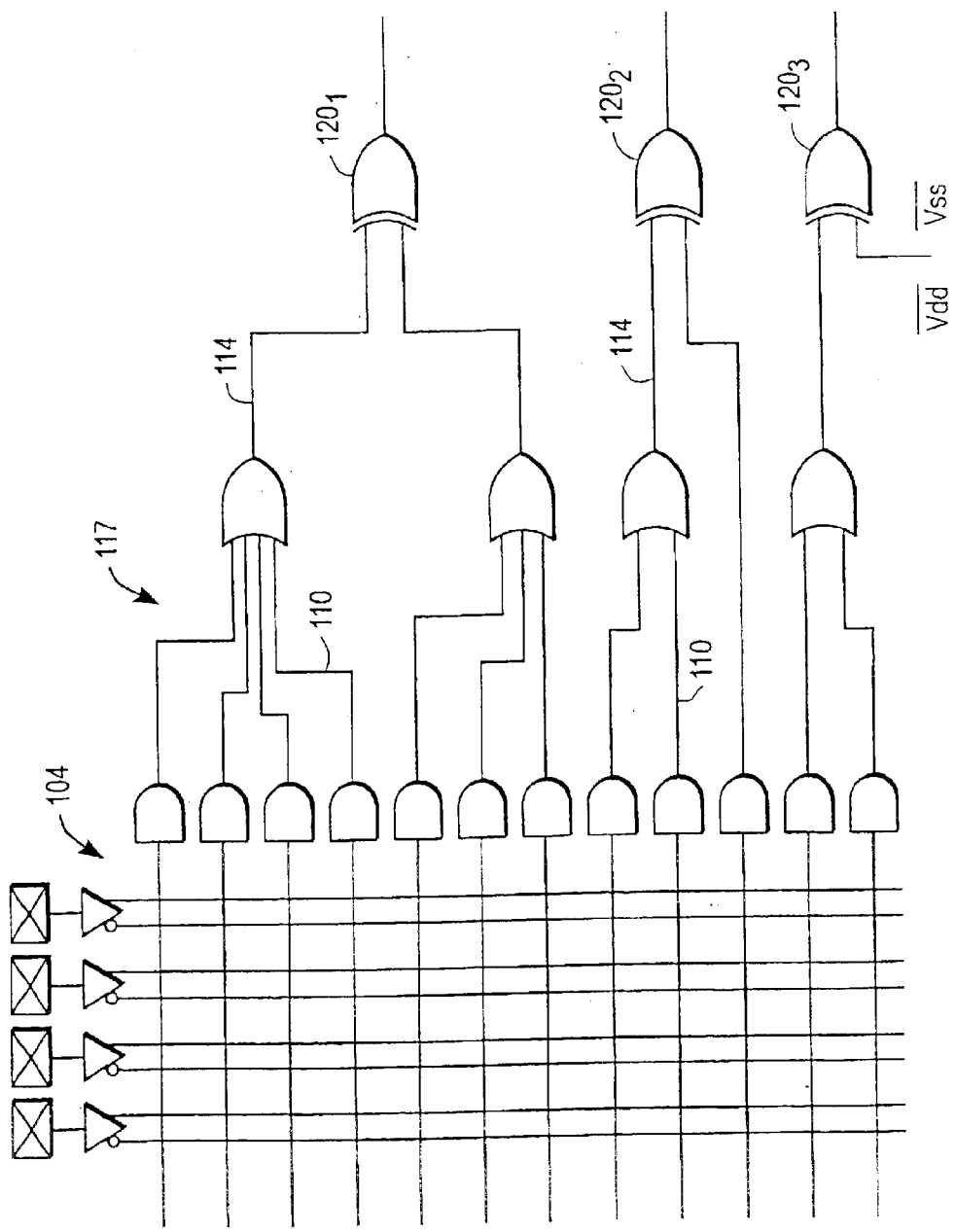
FIG. 6 illustrates post-array logic in conventional PLA structures.
Figure 7:
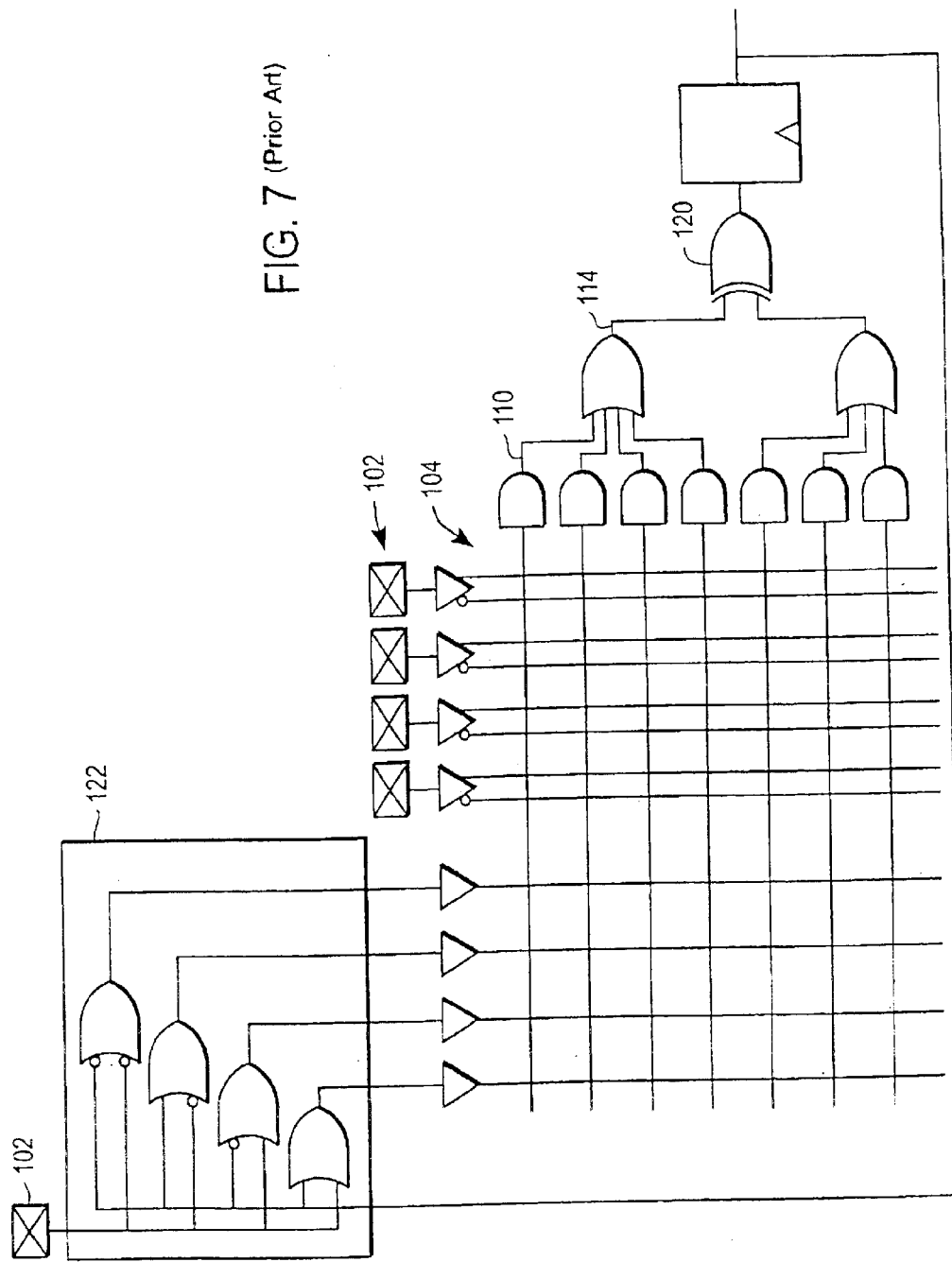
FIG. 7 illustrates pre-array logic in conventional PLA structures.
Figure 8:
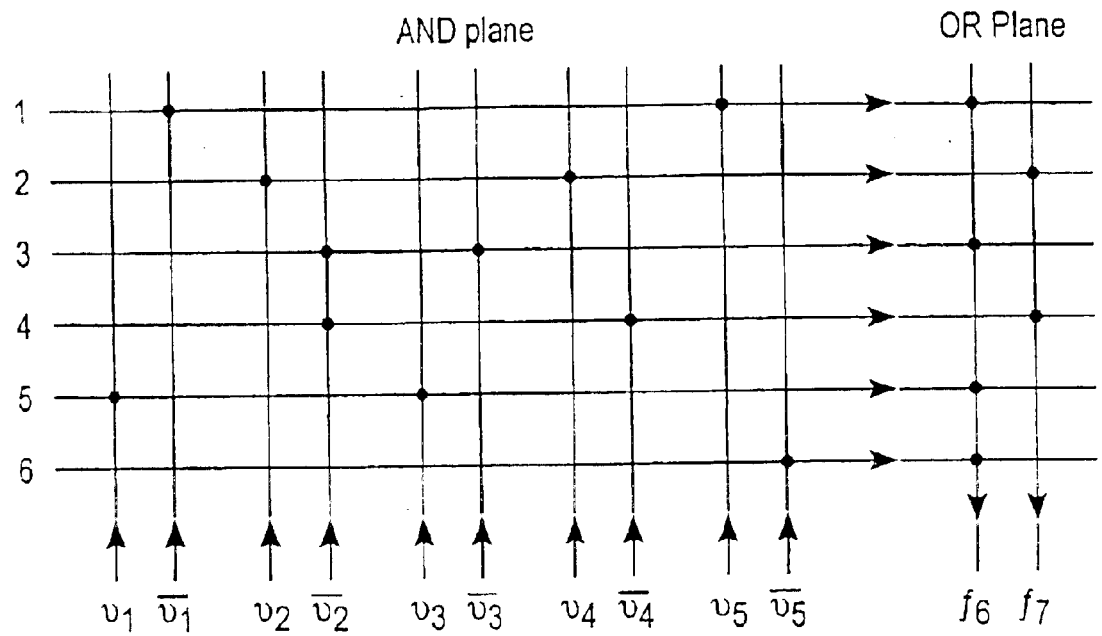
FIGS. 8–9 illustrate an example of PLA folding.
Figure 9:
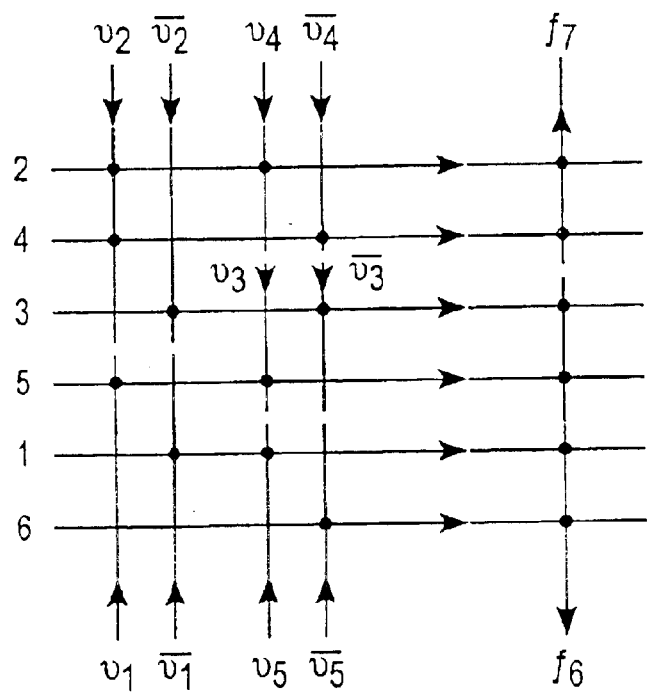

Both the embodiments illustrated in FIGS. 13 and 14 are advantageous over wired-OR structures such as those of FIG. 2. First, the structures of FIGS. 13 and 14 do not require a regular array structure. Therefore, a PLA in accordance with an embodiment of the invention can be made as small as possible without the limitations of a regular array structure. In some situations, portions of the PLA can even be intermixed with other circuitry in a larger custom chip, such as an ASIC described in application Ser. No.09/512,783, filed Feb. 25, 2000, and entitled "Programmable Logic Array Embedded in Mask-Programmed ASIC." Still, even if all portions of the PLA are located in proximity to one another, these portions can be scrambled. Thus, although a PLA in accordance with an embodiment of the invention appears to have a regular structure in the figures, such regularity is shown only for clarity of description. In its physical implementation, a PLA in accordance with an embodiment of the invention need not have any regular structure nor resemble its conventional counterparts at all.

Further, wired-OR structures are notorious for static power consumption since anytime the AND line is pulled low, current flows. But since the structures of FIGS. 13 and 14 use gates, static power consumption can be minimized.

Timing and Performance

Figure 15:
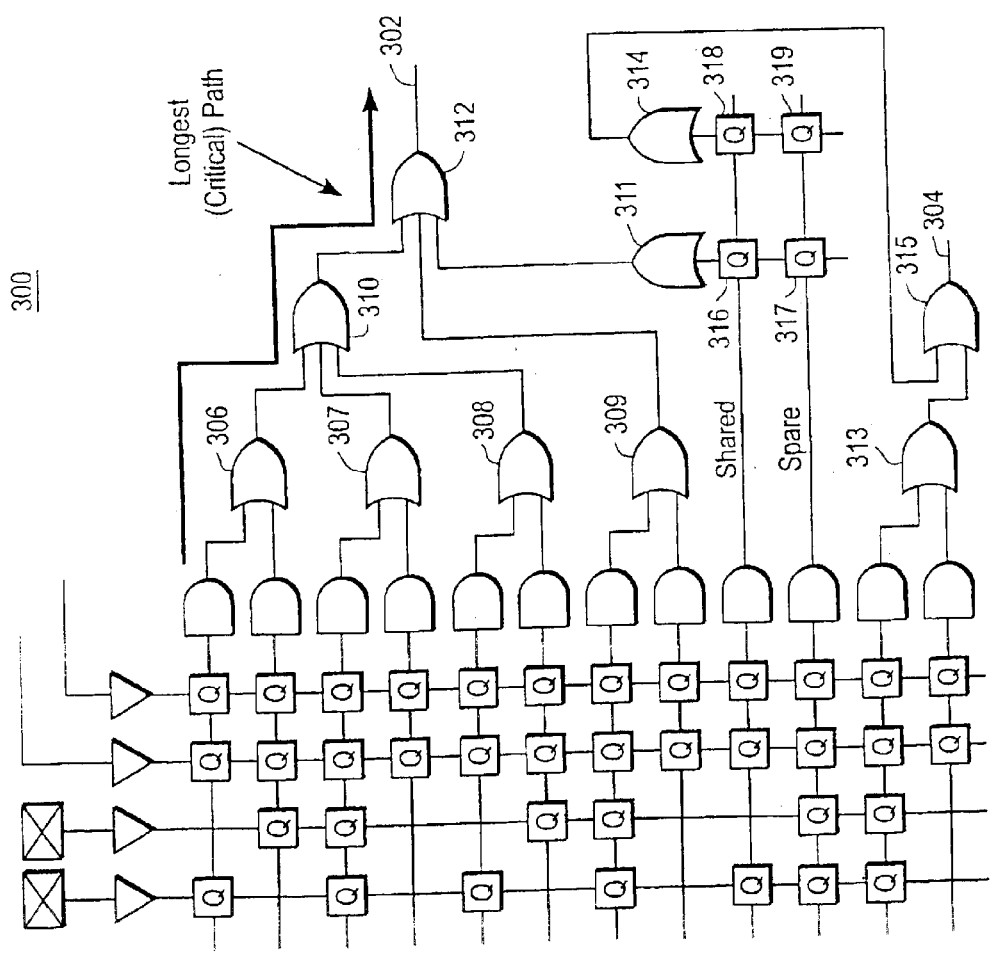
FIG. 15 is a functional diagram of an embodiment of the invention.

Shown in FIG. 15 is an example of a minimally populated PLA 300, having both AND and OR arrays depopulated (similar to FIG. 12). The depopulated OR array results in a number of OR trees such as that shown by OR gates 306–312 and 313–315 as will be understood by those of skill in the art. This example PLA 300 has two outputs 302 and 304, where 302 has a large number of p-terms. The longest critical path will usually be in the largest OR-tree, which path is fixed in the intermediately and minimally populated structures. In FIG. 15, the longest path must pass through three OR gates, e.g., 306, 310, and 312.

The shared and spare p-terms go through the core cells 316–319 as illustrated and therefore have a degree of programmability that allows the steering of p-terms to the different outputs (or disabling the p-terms) when making future changes. Although having these core cells in the paths of the spare and shared p-terms adds some delay to the respective path, the overall effect of this delay in the PLA is not significant: the paths for the shared and spare p-terms join the larger OR-tree close to the output stage of the tree. In other words, the additional delay of the core cells occurs in a shorter path when compared with the longer path occurring in the larger OR-tree. In the example of FIG. 15, the largest path must pass through three OR gates, but the shared/spare terms only pass through two OR gates, 311, 312, rendering the delay through the programmed core cell 316 or 317 insignificant to the output 302.

Thus, a timing model for the PLA structure can be constructed when the PLA is built such that all paths (including the shared and spare paths) are analyzed in determining the maximum and minimum delay paths. So by using such a timing model, all changes that can possibly be made at a later date will result in delays that are within the original specifications for the maximum and minimum delays. Accordingly, using such a method, when the PLA function changes, the timing will not change. This is particularly significant since in many prior art FPGAs the timing is unpredictable when the function of the device changes.

Use of Pre- and Post-array Structures

Use of pre- and post-array logic 330, 332 is also easily accommodated in an embodiment of the invention, as illustrated in FIG. 16 (showing an intermediately populated structure, where the core cells in the AND array are not illustrated). In one embodiment, when the HDL description of the PLA is received, then the description is analyzed to determine if any fixed logic functions would be better implemented as pre- or post-array logic in order to reduce the size of the PLA. Once determined, the user may choose which functions to implement as such pre- or post-array logic and the PLA is then generated based on those choices. Alternatively, an embodiment of the invention could automatically select the pre- and post-array structures to meet certain design goals, e.g., the smallest structure possible.

Complemented P-terms

Figure 18:
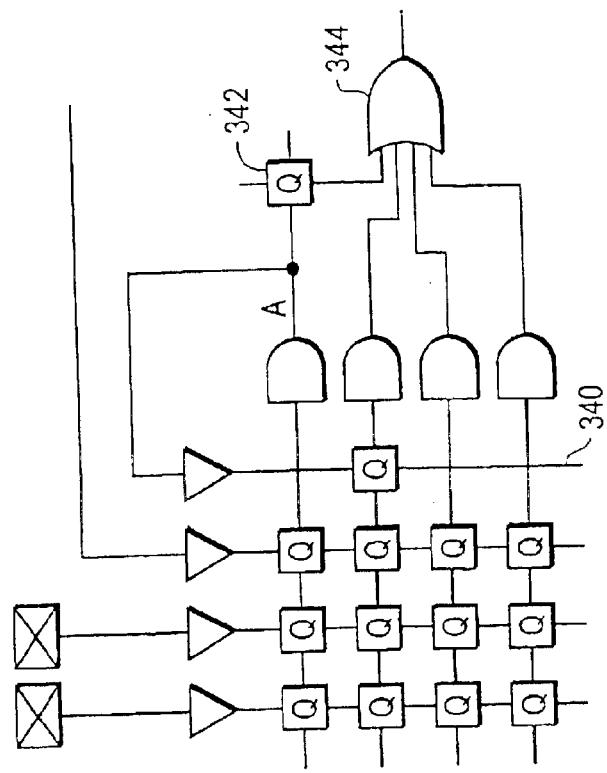
FIGS. 17–21 illustrate complemented P-terms in accordance with various embodiments of the invention.
Figure 17:
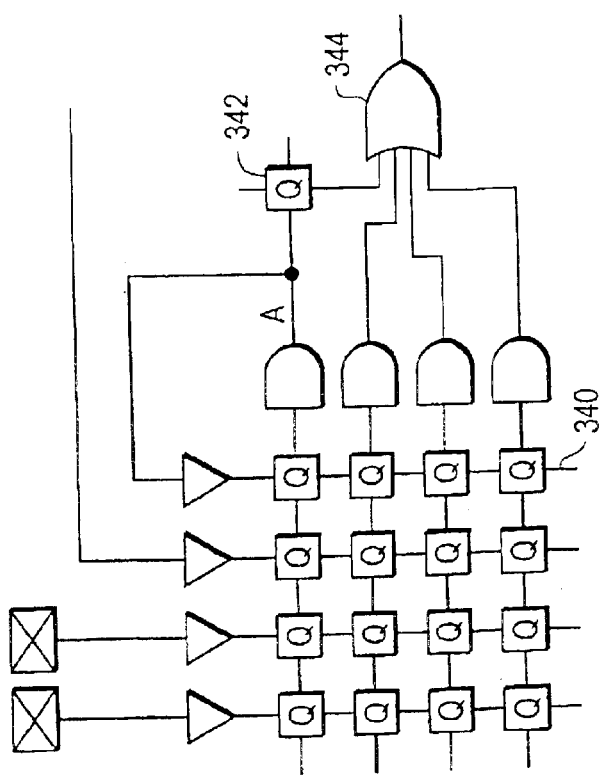
Figure 19:
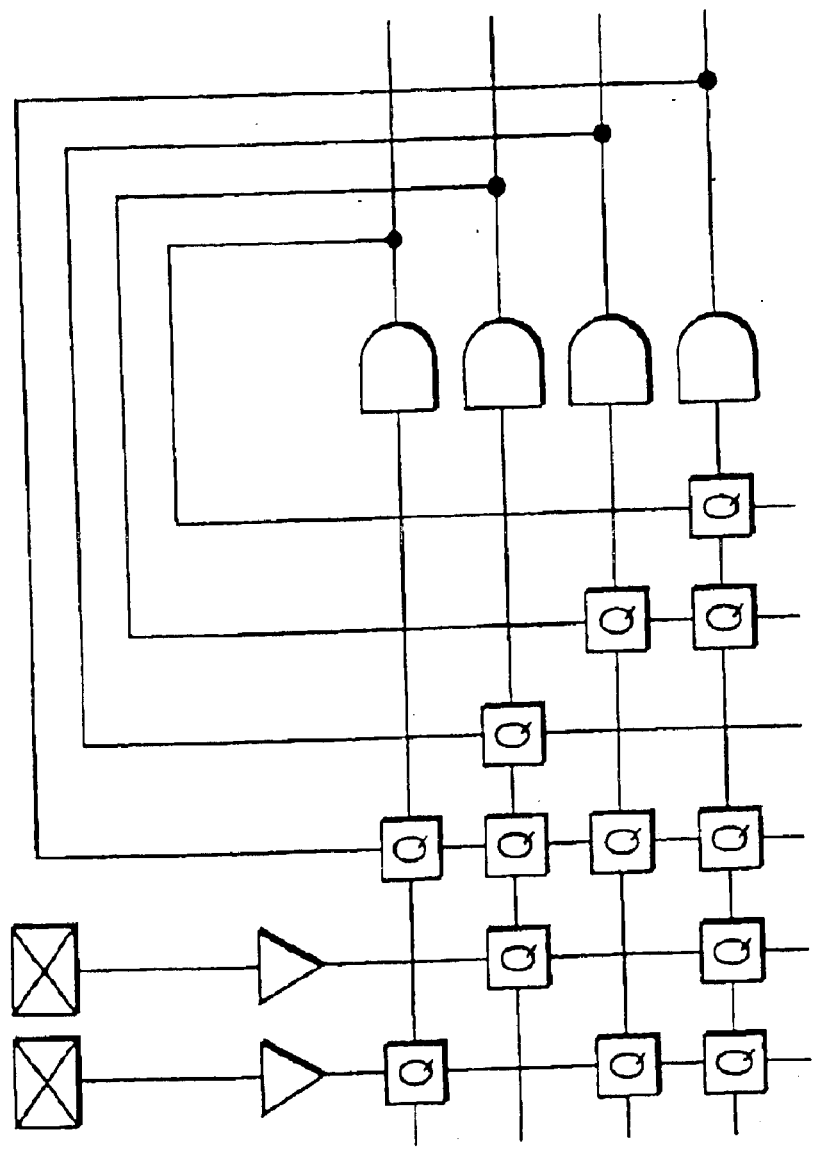

In accordance with an embodiment of the invention, p-terms can also be easily complemented. For instance, as shown in FIG. 17, a product term A can be fed back in the AND array where it connects to all possible p-terms (column 340). The complement of the fed-back p-term can be chosen by the receiving core cell in column 340 in accordance with Table 1. While this provides a flexible solution, driving all possible p-terms may add delay for a signal path that is already long due to making two trips through the array. But since the user logic to be implemented is already known, in an alternative embodiment the column 340 for the fed-back term can be depopulated as shown in FIG. 18. Accordingly, a NAND-NAND (or NOR-NOR) array can be implemented, shown in FIG. 19.

In both FIGS. 17 and 18, the feedback loop for signal A would be used to complement a p-term that is incorporated into another p-term. But if an entire p-term needed to be complemented, it could simply be passed through an inverter and then be passed on to the OR gate. Of course a core cell 342 can be used in place of an inverter, as shown in FIGS. 17 and 18, since it can both invert and disable a p-term programmably. When the entire p-term A is complemented by passing through a core cell 342 and directly into the OR tree 344 (shown as a 4-input OR gate), it should join the OR tree toward its end in order to minimize any added delay, similar to that described in FIG. 15.

When a portion of a p-term needs to be complemented, it is desirable to complement the p-term without incurring additional delay, e.g., by two full passes through the array if feed back is used, and at the same time to keep the array small by not adding many p-terms to perform the DeMorgan equivalent of the p-term. Thus, in one embodiment of the invention shown in FIG. 20, the product term A representing the portion of a larger p-term to be complemented passes through a core cell 350, which programmably performs the inversion, and then joins the AND-tree 352 of another p-term. Again, by joining the tree 352 towards its end, almost all of the delay due to the core cell occurs in parallel and there is minimal additional delay added, if any.

Figure 20:
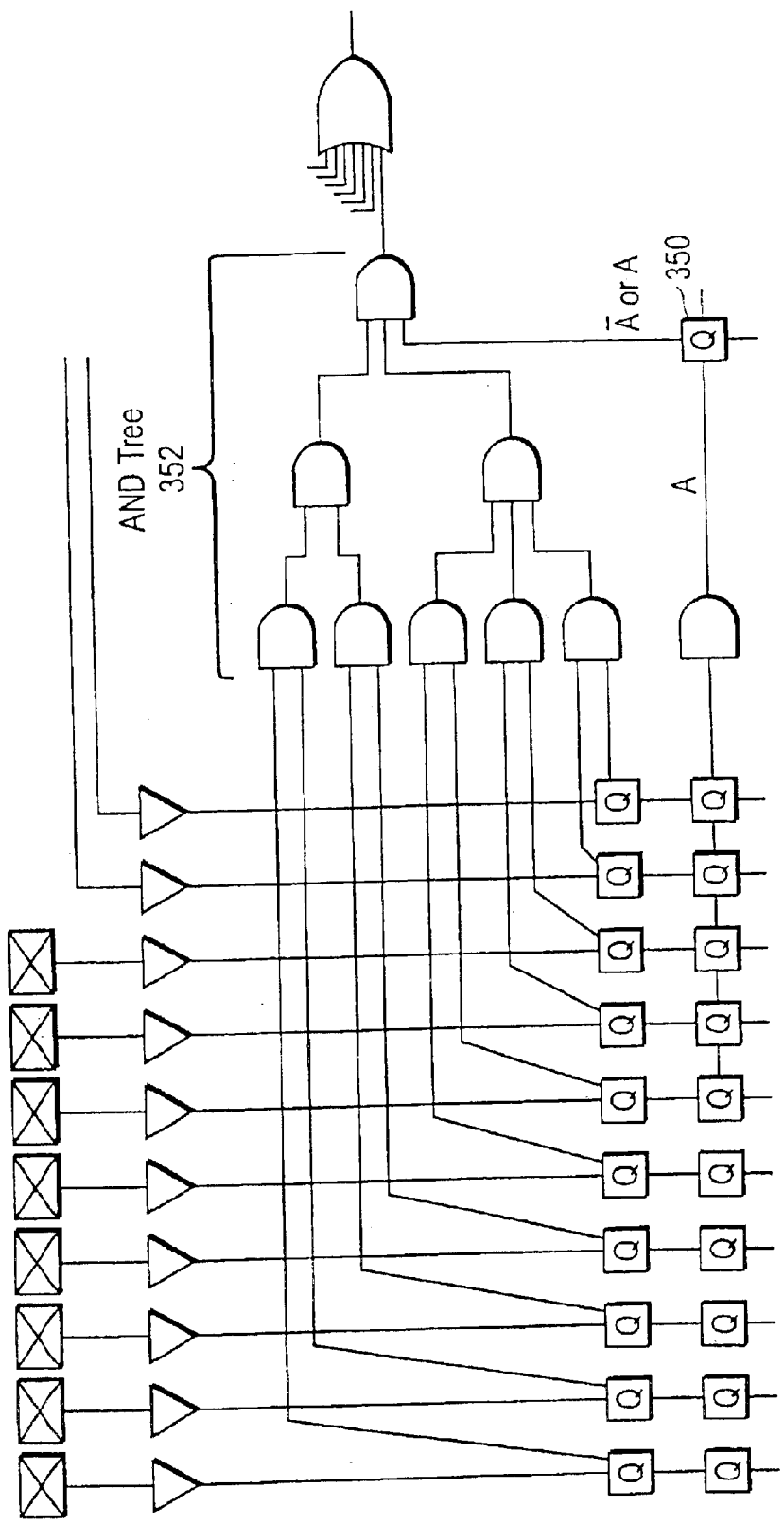
Figure 21:
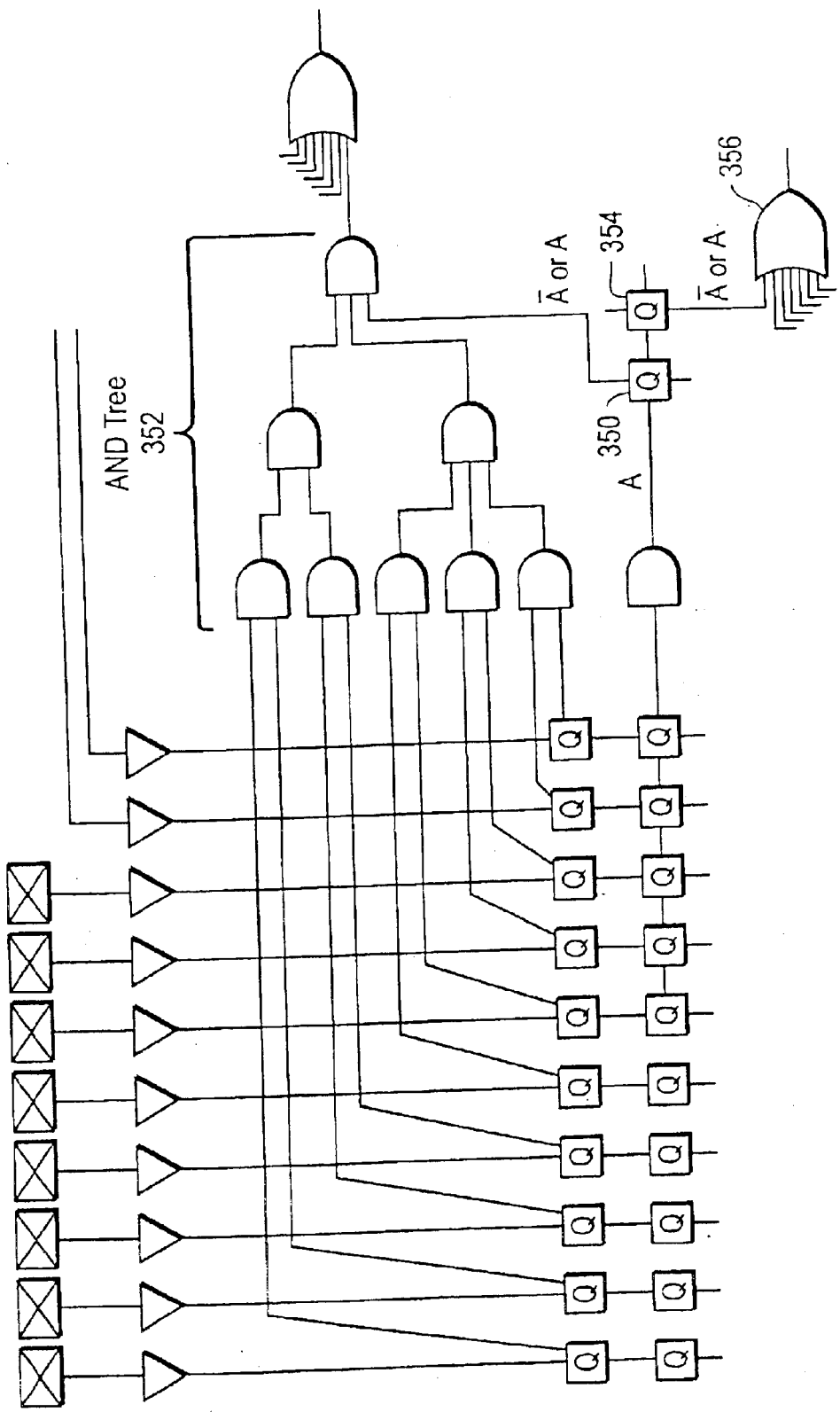

FIG. 21 shows still another embodiment that is similar to that of FIG. 20 except that p-term A can be programmably complemented in its entirety by additional core cell 354 and sent to an OR tree 356 and/or it can be complemented and used in another p-term, joining AND tree 352 as in FIG. 17. As illustrated, by using the core cells, a large amount of flexibility is obtained in that the signal can be steered to different outputs, passed in its true state, complemented, or even disabled.

AND Trees/OR Trees

AND trees and OR trees (as well as buffer trees) have been mentioned above. When building a PLA in accordance with an embodiment of the invention these trees can be built on the fly as needed by the PLA compiler (the program that analyzes the input PLA description and then generates a structural netlist for the PLA). Alternatively, AND and OR trees can be limited to a predefined set of gate primitives used for building trees. Such primitives may be designed such that certain pins/inputs for the primitives are favored due to their speed advantage (e.g., those pins/inputs towards the end of the tree), which will be useful in determining where to add in shared/spare p-terms. Still another method for generating trees is to create a library of all possible trees that will be needed using a synthesis tool like Synopsys Design Compiler as is known in the art. The trees would be synthesized for maximum speed and the tree of the required size would be chosen at the time the PLA is constructed. Again, such trees could be designed such that certain pins/inputs are favored due to their speed advantage.

Specialized Embodiments

A PLA in accordance with an embodiment of the invention could be designed to perform two diverse tasks. In other words, a single PLA could be built, but it may be used in circuitry that could be applied to two distinct applications. In such a case, the functionality for the PLA for each task will be different and the PLA will be programmed based on one set of functionality or the other. In accordance with an embodiment of the invention, the size of the PLA will be generated according to the larger set of functionality and then both sets of functionality will be considered in determining what spare p-terms are created and how depopulation is performed.

In still another embodiment, a user may not be as concerned about the size of the PLA, but may want to maintain as much flexibility as possible as long as the PLA remains fast enough and exhibits certain performance characteristics. In such instances, a depopulated PLA could be modelled as described throughout this document and then tested to measure the performance. If the performance exceeds the selected minimum performance goal (e.g., speed), then spare p-terms are added to the model. The device is then tested again, and the process repeats until the goal is met, e.g., spare p-terms are added until the device just meets or minimally exceeds its minimum acceptable speed characteristics.

Therefore, a device has been described that allows the formation of smaller, faster, yet flexible PLAs. Unlike conventional "folding" techniques device in accordance with an embodiment of the invention requires no regular array structure. Further, distinct from folding, a device in accordance with an embodiment of the invention can depopulate the PLA to a maximum, but then selectively repopulate to allow for future flexibility in reprogramming.

What is claimed is:

1. A method of forming a programmable logic array (PLA), comprising:
   receiving a description of functionality to be implemented by the PLA;
   preparing a PLA model that contains only programmable connections necessary to implement the described functionality;
   selectively adding programmable connections to the PLA model to allow for programming of other functionality; and
   fabricating a PLA based on the model, the PLA remaining programmable at least at the programmable connections added in the step of selectively adding.

2. The method of claim 1, wherein the step of selectively adding programmable connections includes adding programmable connections such that the PLA programmed with the described functionality has certain performance characteristics, and wherein the PLA programmed with other functionality has the same performance characteristics.

3. The method of claim 1, wherein the PLA model has a non-regular physical structure.

4. The method of claim 1, further including:
   receiving a minimum performance goal;
   after selectively adding programmable connections, testing the PLA model to determine if it meets or exceeds the minimum performance goal;
   if the PLA design exceeds the minimum performance goal, selectively adding further programmable connections until the PLA model just meets or only minimally exceeds the minimum performance goal.

5. The method of claim 1, wherein:
   the step of receiving includes receiving a plurality of descriptions of functionality, each description to be independently implemented by the PLA;
   the step of preparing includes preparing a PLA model where the PLA model contains only the programmable connections necessary to implement the described functionality of the descriptions.

6. The method of claim 1, further including:
evaluating the description to determine if pre-array or post-array logic is useful.

7. The method of claim 1, wherein:
selectively adding programmable connections includes adding programmable connections for shared and spare terms.

8. The method of claim 1, wherein:
selectively adding programmable connections includes adding programmable connections for complementing terms.

9. The method of claim 1, wherein:
selectively adding programmable connections includes adding programmable connections for complementing parts of product terms.

10. The method of claim 1, wherein:
the programmable connections each include a storage device and a logic gate; and
the PLA includes product terms and sum terms formed with gate trees.

11. A method of forming a programmable logic array (PLA), comprising:
receiving a description of functionality to be implemented by the PLA;
preparing a PLA model with a depopulated array;
selectively re-populating the array in the PLA model to allow for programming of other functionality; and
fabricating a PLA that remains programmable to implement at least the other functionality.

12. The method of claim 11, wherein the depopulated array is an AND array.

13. The method of claim 11, wherein the depopulated array is an OR array.

14. The method of claim 11, wherein the array has a non-regular physical structure.

15. A method of forming a programmable logic array (PLA), comprising:
receiving a description of functionality to be implemented by the PLA;
preparing a PLA model sized to accommodate the described functionality and fully populated with programmable connections;
removing from the PLA model all programmable connections not necessary to implement the described functionality;
selectively adding programmable connections to the PLA model; and
building a PLA based on the PLA model, the PLA remaining programmable at least at the selectively added programmable connections.

16. The method of claim 15, wherein the step of selectively adding includes selectively adding programmable connections to the PLA model for shared and spare product terms.

17. The method of claim 15, wherein the step of building includes building a PLA having a non-regular physical structure.

18. A method of forming a programmable logic array (PLA), comprising:
receiving a plurality of descriptions of functionality to be implemented by the PLA;
preparing a PLA model that contains only programmable connections necessary to implement the described functionality of the descriptions;
selectively adding programmable connections to the PLA model to allow for programming of other functionality; and
fabricating a PLA in accordance with the PLA model after the steps of preparing and selectively adding, the PLA remaining programmable to implement at least the other functionality.

19. A method of forming a programmable logic array (PLA), comprising:
receiving a plurality of descriptions of functionality to be implemented by the PLA;
preparing a PLA model wherein the PLA model is sized to accommodate the largest described functionality in the plurality of descriptions;
removing from the PLA model programmable connections not necessary to implement the described functionality of the descriptions; and
fabricating a PLA in accordance with the PLA model after the steps of preparing and removing, the PLA remaining programmable to implement at least the functionality of each of the descriptions received in the step of receiving.

20. The method of claim 19, further including:
selectively adding programmable connections to the PLA model to allow for programming of other functionality.

21. A method of forming a programmable logic array (PLA), comprising:
receiving a description of functionality to be implemented by the PLA;
determining if pre-array or post-array logic will be useful to enhance the speed or reduce the size of the PLA;
preparing a PLA model based upon the step of determining; and
building the PLA based on the PLA model, the PLA remaining programmable after fabrication.

22. The method of claim 21, wherein the step of preparing further includes:
preparing a PLA model with at least a partially depopulated array.

23. A computer readable storage medium having instructions stored therein to be used in forming a programmable logic array (PLA), which instructions when executed by a computer cause the computer to perform the steps of:
receiving a description of functionality to be implemented by the PLA;
preparing a PLA model that contains only programmable connections necessary to implement the described functionality;
selectively adding programmable connections to the PLA model to allow for programming of other functionality.

24. A computer readable storage medium having instructions stored therein to be used in forming a programmable logic array (PLA), which instructions when executed by a computer cause the computer to perform the steps of:
receiving a description of functionality to be implemented by the PLA;
preparing a PLA model with a depopulated array;
selectively re-populating the array in the PLA model to allow for programming of other functionality.

* * * * *